United States Patent
Sugihara

(10) Patent No.: US 8,279,406 B2
(45) Date of Patent: Oct. 2, 2012

(54) ARTICLE LOADING/UNLOADING METHOD AND ARTICLE LOADING/UNLOADING DEVICE, EXPOSURE METHOD AND EXPOSURE APPARATUS, AND METHOD OF MANUFACTURING DEVICE

(75) Inventor: Tara Sugihara, Tokyo (JP)

(73) Assignee: Nikon Corporation, Tokyo (JP)

( * ) Notice: Subject to any disclaimer, the term of this patent is extended or adjusted under 35 U.S.C. 154(b) by 729 days.

(21) Appl. No.: 12/083,863

(22) PCT Filed: Oct. 18, 2006

(86) PCT No.: PCT/JP2006/320763
§ 371 (c)(1),
(2), (4) Date: Apr. 20, 2009

(87) PCT Pub. No.: WO2007/046430
PCT Pub. Date: Apr. 26, 2007

(65) Prior Publication Data
US 2009/0213347 A1 Aug. 27, 2009

(30) Foreign Application Priority Data
Oct. 19, 2005 (JP) ................................. 2005-304602

(51) Int. Cl.
*G03B 27/58* (2006.01)
(52) U.S. Cl. ........................................... 355/72; 355/75
(58) Field of Classification Search .................... 355/72, 355/73, 75, 76, 77
See application file for complete search history.

(56) References Cited

U.S. PATENT DOCUMENTS
5,897,986 A * 4/1999 Dunn et al. ..................... 355/77
6,690,450 B2 * 2/2004 Nishi ............................... 355/30

FOREIGN PATENT DOCUMENTS
JP 2004-247548 9/2004

OTHER PUBLICATIONS
International Preliminary Report on Patentability, mailed Jul. 10, 2008 and issued in corresponding International Patent Application No. PCT/JP2006/320763.

* cited by examiner

*Primary Examiner* — Glen Kao
(74) *Attorney, Agent, or Firm* — Staas & Halsey LLP

(57) ABSTRACT

A loading/unloading method to perform quickly exchanging an article to be loaded on a placing table. The method comprises: positioning the placing table, where article to be unloaded is placed, to a second position that is different from a first position; unloading the article that exists on the placing table; moving the placing table from the second position to the first position while the vertically moving member is positioned at a position lower than a lower surface of a loading member holding a next article and higher than the placing surface of the placing table; allowing a loading member holding the next article to wait over the first position before the placing table is positioned at the first position; and loading the next article onto the place table positioned at the first position after the placing table is moved to the first position.

6 Claims, 5 Drawing Sheets

ARTICLE LOADING/UNLOADING METHOD AND ARTICLE LOADING/UNLOADING DEVICE, EXPOSURE METHOD AND EXPOSURE APPARATUS, AND METHOD OF MANUFACTURING DEVICE

This application claims the benefit under 35 U.S.C. Section 371, of PCT International Application No. PCT/JP2006/320763, filed Oct. 18, 2006, which claimed priority to Japanese Patent Application 2005-304602, filed Oct. 19, 2005, the contents of which are incorporated herein by reference.

TECHNICAL FIELD

This invention relates to a loading/unloading method for an article to conduct loading/unloading an article such as substrate, mask and the like, an exposure method an exposure device using thereof, and a method for making a device using the exposure method.

BACKGROUND ART

In a Photolithography process which is one of steps of manufacturing process for semi-conductor, a resist coating device (coater) for coating photosensitive agent (photoresist) on a substrate (article) such as wafer and glass plate, an exposure device (stepper) for forming a latent image of a pattern by transferring the pattern of a reticle (mask) onto a substrate on which said photosensitive agent is coated, and a developing device (developer) for developing the latent image formed on the substrate and the like are used. For transferring a substrate between the resist coating device and the exposure device, and between the exposure device and the developing device, there is a device to perform the transfer substrates in batches by using a substrate carrier (substrate cassette) which is available to store plurality of substrate, or a device which transfers the substrates between the substrate carrier and the resist coating device arranged by the exposure device which is used with combination of the substrate carrier or is used individually (inlined). The resist coated substrate is stored in the substrate carrier or individually loaded to a predetermined loading position of the substrate transferring device, and is transferred to a predetermined delivering position (loading position) for delivering to an exposure main body (substrate stage) by the substrate transferring device. On the other hand, an exposure finished substrate is delivered at a predetermined delivering point (loading point) for receiving the substrate from the exposure main body, and the substrate is transferred by the substrate transferring machine, and is stored to the substrate carrier, or a loaded to a next exposure device individually.

Although various of devices as a substrate transferring machine have been known, for example, an articulated robot having an arm portion to move the substrate with negative absorption, there provided a loading arm and unloading arms having both slider to perform linear movement, performing reciprocation between the loading position for delivering with a substrate stage of the exposure main body portion or the unloading position and a hoop position or C/D delivering position, respectively. The delivering points (loading position, unloading position) between the substrate transferring device and the exposure main body portion are arranged hierarchically in horizontal direction (here, defining the unloading position is lower side and the loading position is upper side). The delivering between the loading arm or the unloading arm and the substrate stage is performed through a vertically moving means which is movable for positioning horizontally provided with the substrate stage (center table). Namely, the substrate loading and unloading to the substrate stage is performed with a status that the substrate stage is positioned at same a position, conventionally.

However, in case that the loading position and unloading position to perform loading/unloading the substrate to the substrate stage, are arranged hierarchically in horizontal (Z-direction), stroke of the vertically moving means becomes large necessarily, because a driving speed of vertically moving means is not so fast generally, a required for loading/unloading substrate becomes long time, there is a case to prevent treating acceleration. Additionally, after the substrate is delivered from the vertically moving member to the unloading arm, it is necessary to operate a further lifting operation of the vertically moving member for receiving the substrate from the loading arm after the unloading arm retracts from the unloading position which inhibits the treating acceleration too.

DISCLOSURE OF INVENTION

The present invention has been made due to considering such problems of the conventional art, a purpose of the invention is to shorten a required time for article loading/unloading and to accelerate the treatment.

According to the present invention, there provided that a method for loading/unloading article to a placing table that is moved for positioning within a predetermined plane and has a vertically moving member that moves vertically with holding the article between over the placing table and a placing surface of the article provided on the placing table comprising; a first step of determining a position of said placing table, where the articles to be unloaded is placed, to a second position that is different from a first position within said predetermined plane, a second step of unloading the article exist on the placing table that is positioned at said second position after said first step is performed, a third step of determining a position of said placing table at said first position while said vertically moving member is positioned at a position higher than the placing surface of the placing table, it is possible to commence the delivering of the article quickly after positioning the placing table to the first position. Also, a moving length of the vertically moving member can be shortened further, and acceleration of exchange treatment of the article can be achieved.

BEST MODE FOR CARRYING OUT THE INVENTION

Below, embodiments of the present invention will be described based on drawings. Note that, in the following explanation, first, a whole constitution of an exposure apparatus will be explained briefly, then, a wafer transferring apparatus will be explained specifically.

[Exposure Apparatus]

Figure 1:
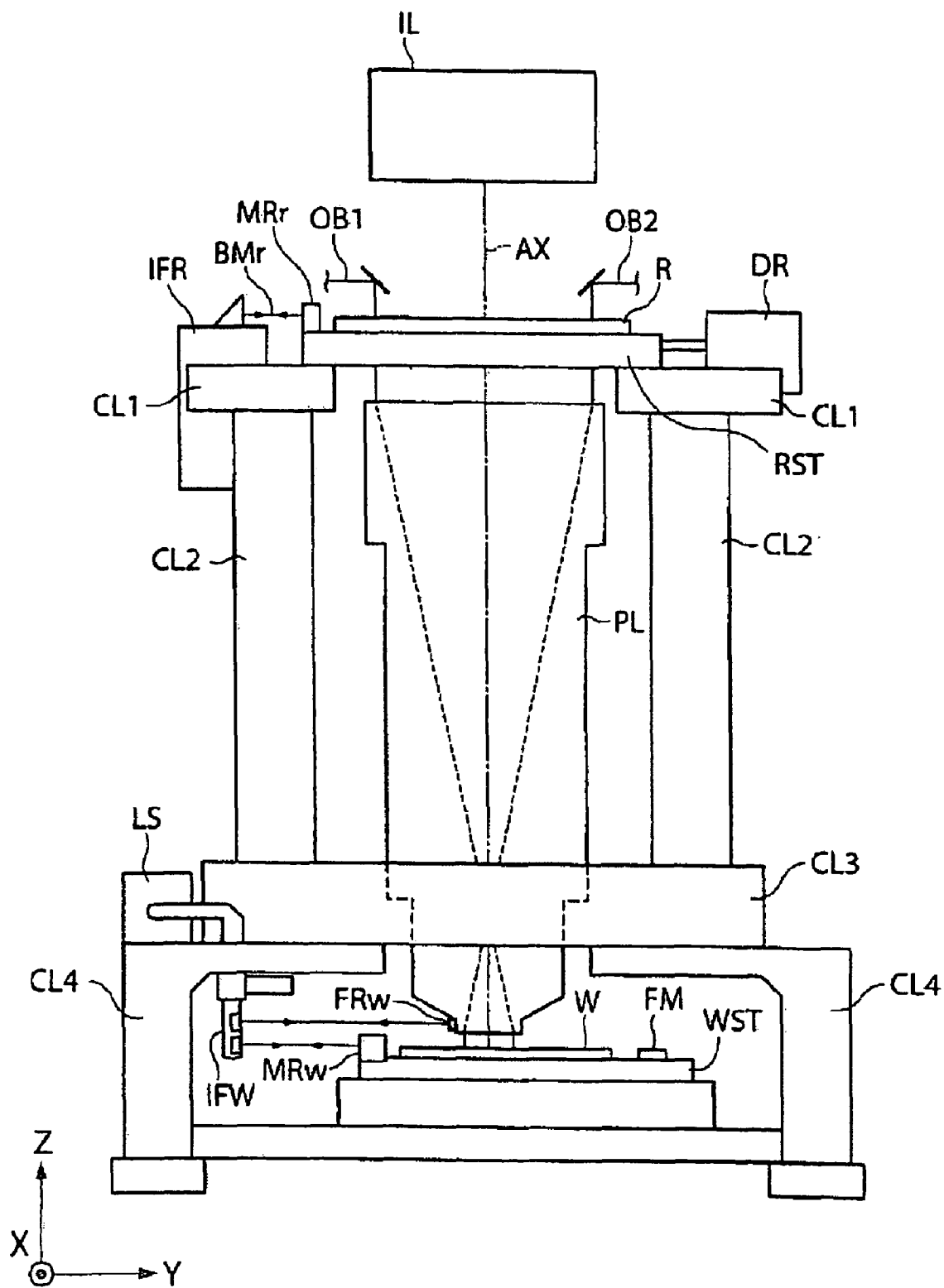
FIG. 1 is a plane view schematically showing a whole constitution of an exposure apparatus according to an embodiment of the present invention.

An exposure apparatus according to the present embodiment shown in FIG. 1 is a step and scan type exposure apparatus wherein a pattern formed on a reticle R is sequentially transformed onto a wafer F according to synchronize movement of a reticle stage RST and a wafer stage WST to a projection optical system PL. Note that, in the following explanation, setting an XYZ-orthogonal coordinate system in drawings, a positioning relation for respective members will be described with reference to the XYZ-orthogonal coordinate system. In the XYZ-orthogonal shown in FIG. 1, a XY-plane is set to a plane which is parallel to a horizontal plane, a Z-axis is set to a vertical rise direction. A direction in line with a Y-axis is a scan direction.

In FIG. 1, an illumination optics system IL shapes a cross section of a laser beam irradiated from an optical source such as ArF excimer laser light source (wavelength of 193 nm) and the like as slit-shaped which extends the X-direction, and illumination distribution thereof is lower than a lower surface of a loading member holding a next article waiting for loading over said first position and higher than the placing surface of the placing table, after said second step is performed, a fourth step of allowing a loading member holding the next article to be loaded onto the placing table to wait over the first position before the placing table is positioned at the first position, and a fifth step of loading the next article onto the placing table positioned at the first position after the third step is performed.

In the present invention, since the article loading/unloading positions to the placing table (a first position, a second position) are different in a predetermined plane where the placing table is moved, a stroke of the vertically moving member can be shortened comparing with a conventional device to perform loading/unloading in a same position of a plane, a limitation of action during operation can be reduced and thus, acceleration of exchange treatment of the article can be achieved. In addition to this, it is made a loading member holding a next article to be loaded and waiting over said first position before the placing table is positioned at the first position, and the placing table is moved from the first position to the second position with a condition that the vertically moving member is positioned at a position lower than a lower surface of a loading member and unified and projected as illumination light. Note that, in the present embodiment, although the ArF excimer laser light source is exemplified as a light source, other than this, an extra-high pressure mercury lamp which projects g-line (wavelength of 436 nm), i-line (wavelength of 365 nm) or KrF excimer laser (wavelength of 248 nm), $F_2$ laser (wavelength of 157 nm) and other light source may be used.

The reticle R is absorbed and hold on the reticle stage RST, a moving mirror MRr is fixed at one end on the reticle stage to which a measuring beam BMr from an interferometer system of reticle IFR is illuminated. The reticle is positioned by a driving system DR which causes translation of the reticle stage RST within the XY-plane vertical to an optical axis AX and causes minute rotation within the XY-plane. When a pattern of the reticle is transferred onto the wafer F, the driving system DR scans the reticle stage RST to the Y-direction at constant velocity. Alignment systems OB1 and OB2, so that photoelectric detect a mark for a reticle alignment formed at two portions around the reticle R, are formed above the reticle stage RST. The detected results of the alignment system OB1 and OB2 are used for positioning the reticle R at predetermined accuracy to the illumination optics system IL or the optical axis AX of the projection optical system PL.

The reticle stage RST is movably hold on a reticle stage base structure CL1 which constitutes a portion of a column structure of an apparatus main body, a motor and the like of the driving system DR is also equipped on the base structure CL1. Also, a beam interference portion (beam splitter and the like) of the interferometer system of reticle IFR is equipped on the base structure CL1. The interferometer system IFR projects the measuring beam BMr to the moving mirror MRr fixed on one end portion of the reticle stage RST, and receives a reflection beam thereof to measure change of position of the reticle R. An image formed on the reticle R is imagery projected onto the wafer W with projection ratio ¼ or ⅕ through the image projection optical system PL arranged directly underneath of the reticle stage RST. A lens barrel of the image projection optical system PL is fixed to a lens base structure CL3 which constitutes a portion of the column structure, the lens base structure CL3 supports the reticle base structure CL1 via plurality of cylindrical structure CL2. The lens base structure CL3 is fixed onto a wafer base structure CL4 to which a wafer stage WST moving two-dimensionally along with the XY-plane, the wafer is loaded thereto. Although it is not shown in drawings, a wafer holder for vacuum hold-down the wafer W and a leveling table to cause minute moving of the wafer holder to the Z-direction (optical axis AX direction) and to cause minute inclination.

Figure 2:
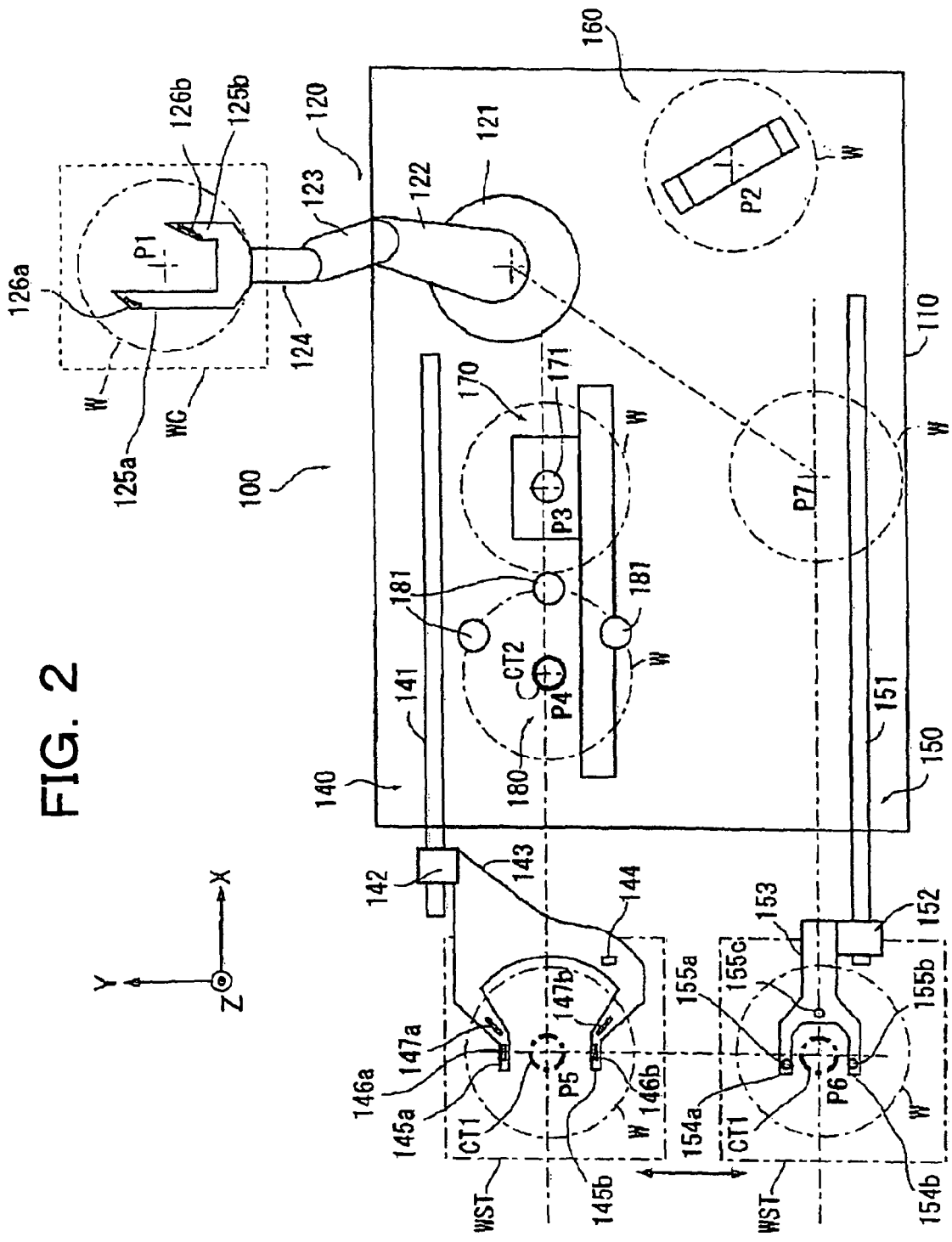
FIG. 2 is a plane view showing a constitution of a wafer transferring apparatus according to an embodiment of the present invention.

In addition, although it is not shown in FIG. 1, at a center portion of the wafer holder, a vertically movable center table CT1 to horizontal direction (the Z-direction) is provided (refer to FIG. 2 or FIG. 5). The center table CT 1 is a vertical movement mechanism for loading/unloading the wafer W to the wafer stage WST (wafer holder). At a tip end portion, the center table CT 1 is composed as positionable at arbitrary positions between an upper dead point over a following mentioned predetermined loading position or unloading position and a bottom dead point lower than a loading face of the wafer W of the wafer holder, for vacuum hold-down the wafer W is arranged. At a center thereof, an absorption opening for vacuum hold-down the wafer W is arranged. Note that a vertically moving mechanism composed of freely movable three pins may be provided instead of the center table CT1.

A moving coordinate position and a minute rotation amount by yawing within the XY-plane of the wafer stage WST are measured by an interferometer system for wafer IFW. The interferometer system for wafer IFW projects a laser beam from the laser light source LS to the moving mirror MRw fixed to the leveling table of the wafer stage WST and a fixed mirror FRw fixed on the lowest portion of the projection optical system PL, and the coordinate position and the minute rotation amount (yawing amount) of the wafer stage WST are measured by interfering reflection beams from respective mirrors MRw and FRw. Further, an orientation plate FM which is used for measuring calibrations and base like amounts of vary of alignment system, focus sensor and leveling sensor is equipped on the leveling table of the wafer stage WST. An orientation mark, which can be detected by the alignment OB1 and OB2 with a mark of the reticle R under an illumination light of exposure wavelength, is formed on the orientation plate FM.

[Wafer Transferring Apparatus]

FIG. 2 is a plane view showing a wafer transferring apparatus according to an embodiment of the present invention. This wafer transferring apparatus 100 is an apparatus for conveying the wafer W as a transforming object between a delivering position P2 to a wafer carrier (wafer cassette) WC to be loaded at a predetermined hoop position P1 or to a resist coating apparatus (coater) to perform resist coating process which is treatment process before an exposure apparatus, or a developing apparatus (developer) to perform developing process which is after treatment process and a predetermined loading position P5 or unloading position P6 to the wafer stage WST of the exposure apparatus.

The wafer transferring apparatus 100 is composed by arranging a loading/unloading robot (herein after referred as "conveying robot") 120, a loading slider 140, a unloading slider 150, a first pre-alignment unit (pre-aligner) 170 and a second pre-alignment unit 180. The conveying robot 120 is a scalar type articulated robot which is composed of a robot base 121, a first arm 122 of which one end portion is rotatably equipped to the first base 121, a second arm 123 of which one end portion is rotatably equipped to another end portion of the first arm 122, a hand portion 124 of which a tip end portion is rotatably equipped to another portion of the second arm 123. Driving portions composed of servo motor and rotary encoder and the like are provided to joint portions of the robot base 121, the first arm 122, the second arm 123 and the hand portion 124, by controlling them, the hand portion 124 can be positionable at arbitrary position and arbitrary attitude.

The hand portion 124 comprises a pair of finger portions 125a and 125b at a tip end thereof, and absorption grooves 126a and 126b are arranged around tips of respective finger portions 125a and 125b to provide-negative pressure for vacuum hold-down the wafer W. The finger portions 125a and 125b of the hand portion 124 are designed that a length of the one finger portion 126b is shorter than the other finger portion 126a upon considering freedom when delivering the wafer W. In the absorption grooves 126a and 126b, outer wall portions of the grooves are formed slightly higher so as not to touch the finger portions 125a and 125b to a back face of the wafer W when the wafer W is hold, by performing vacuum hold-down via a port not shown in drawings which is connected to a negative-pressure supplying tube at a back face.

A loading slider 140 is composed of a loading arm (hand portion) 143 equipped to a slider 142 which is slidable along with a guide 141. The loading arm 143 comprises a pair of finger portion 145a and 145b symmetrically arranged to a predetermined center axis (here, an axis parallel to a sliding direction), pluralities of absorbing grooves 146a, 146b, 147a, 147b for vacuum hold-down the wafer W to be loaded, are provided at each finger portions 145a and 145b. In the absorbing grooves 146a, 146b, 147a, 147b, outer wall portions thereof are formed slightly higher so as not to touch the finger portions 145a and 145b to a back face of the wafer W when the wafer W is hold, by performing vacuum hold-down via a port not shown in drawings which is connected to a negative-pressure supplying tube at a back face.

The slider 142 is driven by a driving portion having ball-screw mechanism and linear encoder which are not shown, the loading arm 143 is caused to move reciprocating between a position P4 where a second pre-alignment unit 180 is arranged and a loading position P5 to the wafer stage WST. A mark 144 is provided on the loading arm 143, a position of the mark 144 is detected by a photoelectric detector, a position of the wafer stage WST is corrected based on the detected result, delivering of the wafer W is made with keeping a condition that a relative position of the center table CT1 and the loading arm 143.

A unloading slider 150 is composed of a unloading arm (hand portion) 153 equipped to a slider 152 which is slidable along with a guide 151. The unloading arm 153 comprises a pair of finger portion 154a and 154b, absorbing pins 155a, 155b, 155c are provided to vacuum hold-down the wafer W. In the absorbing pins 155a, 155b, 155c, outer wall portions thereof are formed slightly higher so as not to touch the unloading arm 153 to a back face of the wafer W when the wafer W is hold, by performing vacuum hold-down via a port not shown in drawings which is connected to a negative-pressure supplying tube at a back face. A delivering table 160, although a specific illustrate is omitted, comprises shelves of multiple stages, and these shelves comprises at least a shelf for receiving the wafer from a resist coating apparatus not shown, and a shelf for delivering an exposure apparatus not shown, a shelf to keep the wafer W during a certain period for applying the wafer loaded from the resist coating device to inner atmosphere of the exposure apparatus in response to necessity or a shelf having a cooling plate for positively cooling to meet the atmosphere temperature in the exposure machine and the like.

A first pre-alignment unit 170 is a unit for laugh positioning a direction of a center of the wafer W and a notch (or orientation flat) by detecting an outer shape of the wafer W with rotating thereof, and composed of a turn table 171 and a sensor for detecting outer shape (not shown). A second pre-alignment 180 is a unit for further aligning the center of the wafer and rotation thereof with taking an image at three points of outer circumference of the wafer W by CCD camera 181, 181, 181, and comprises a center table CT2. The center table CT2 can hold an about center of the wafer W by vacuum hold-down, and can be moved vertically, the X and Y-directions.

Next, a transferring performance of the wafer W in this transferring apparatus 100 will be explained. The wafer W stored in the wafer carrier WC loaded to the hoop position p1 or stored in a predetermined shelf of the delivering table 160 is removed by the conveying robot 120, and transferred to a delivering point P3 with the first pre-alignment unit 170 and delivered onto the turn table 171. Next, the turn table 171 is rotated, the outer shape and the notch potion (or orientation flat portion) of the wafer W are detected by a sensor of the first pre-alignment unit 170, the center portion and the rotation direction of the wafer W are relatively laugh positioned to a predetermined reference. Thereafter, the wafer W is transferred to the second pre-alignment unit 180.

In the second pre-alignment unit 180, images of predetermined three portion of the outer shape of the wafer Ware taken by the CCD camera 181, 181, 181, the center position and the rotation direction are positioned further precisely, based on the image taking result thereof. Then, the Wafer W is delivered to the loading arm 143 of the loading slider 140 waiting in advance at a predetermined position at +X-axis direction side, and transferred to −X-axis direction side, the wafer W is transferred to the loading position P5 to the wafer stage WST. At this time, a position of the mark 144 provided on the loading arm 143 of the loading slider is detected, an accident error according to transfer by the loading slider 140 is corrected, the wafer W is delivered to the wafer stage WST with a status that the loading arm 143 which holds the wafer W to be loaded to the wafer stage WST is precisely positioned at the loading position P5. Next, the wafer W is absorbed and retained on the wafer holder via the center table CT1 on the wafer stage WST, transferred to a predetermined exposure position by the wafer stage WST, an image pattern of the reticle R is exposed and transferred onto the wafer W, thereafter, the wafer stage WST is moved, and the wafer W is positioned on a predetermined unloading position P6. Note that the loading position P5 and the unloading position P6 are arranged and spaced each other to the Y-direction in the XY-plane, a length thereof is preferably as possible as close within a range that the loading slider 140 and the unloading slider 150 and the like are not interfered each other. The exposure treatment finished wafer W is delivered to the unloading arm 153 of the unloading slider 150 via the center table CT1. Next, the wafer W is transferred to a delivering position P7 with the conveying robot 120 by the unloading slider 150, and is delivered to the hand portion 124 of the conveying robot 120. The wafer W delivered to the hand portion 124 of the conveying robot 120 is transferred to an internal to the wafer carrier WC provided on the hoop position P1 or to a predetermined shelf for unlading to the exposure apparatus of the delivering table 160 (delivering position P2).

Figure 3:
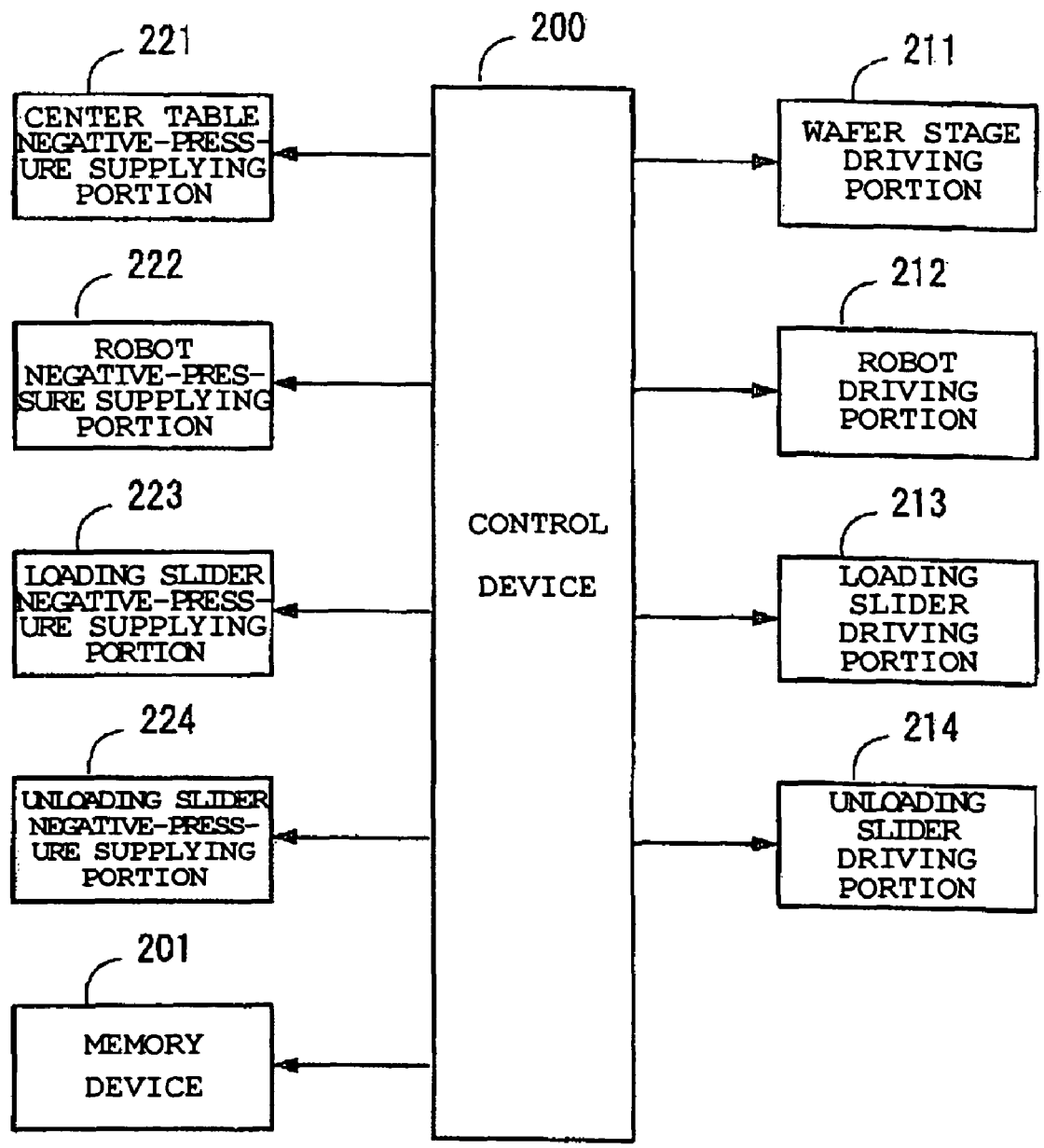
FIG. 3 is a block diaphragm showing a constitution of driving control system according to an embodiment of the present invention.

FIG. 3 is a block diaphragm showing structures of a driving control system for the above mentioned wafer stage WST, the conveying robot 120, the loading slider 140, and the unloading slider 150. A control device 200, which generally controls the exposure apparatus and the transferring device 100, suitably controls operations of a wafer stage driving portion 211 for driving the wafer stage WST and the center table CT1, a robot driving portion 212 for driving the conveying robot 120, a loading slider driving portion 213 for driving the load slider 140, a unloading slider driving portion 214 for driving the unloading slider, a center table negative-pressure supplying portion 221 for supplying negative-pressure to the center table CT1, a robot negative-pressure supplying portion 222 for supplying negative-pressure to the arm portion 124 of the conveying robot 120, a loading slider negative-pressure supplying portion 223 for supplying negative-pressure to the loading arm 143 and a unloading slider negative-pressure supplying portion 224 for supplying negative-pressure to the unloading arm 153, based on controlling information memorized in a memory device 20 and detected information from various sensors (vacuum pressure sensor, position detection sensor, stage interferometer and the like).

Figure 4:
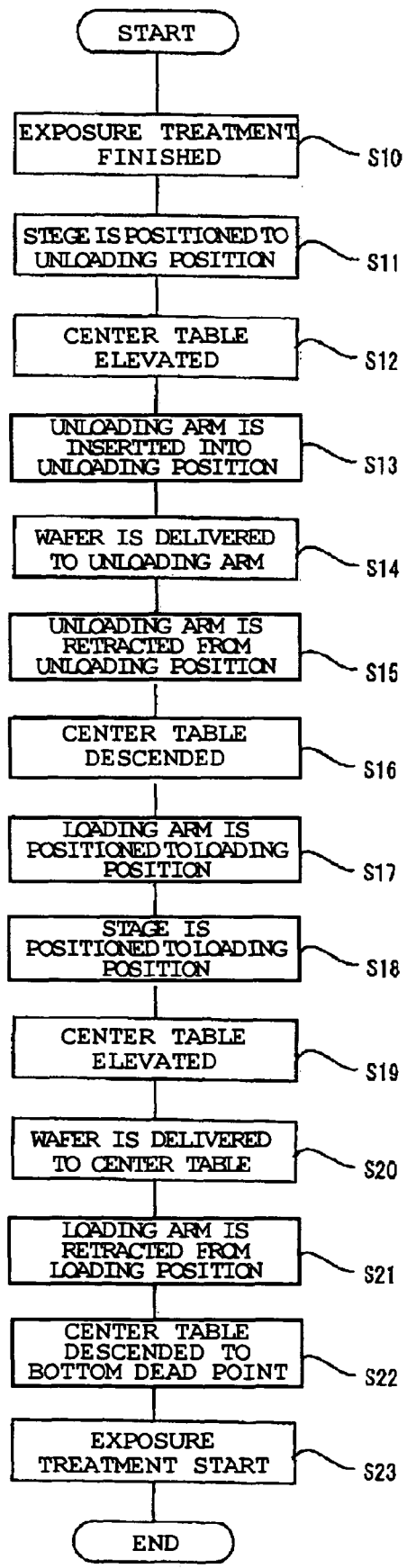
FIG. 4 is a flowchart showing wafer exchange treatment according to an embodiment of the present invention.

FIG. 4 is a flowchart showing wafer exchange process implemented by the control device 200, and FIG. 5(A) to FIG. 5(F) are drawings schematically showing operations for each portion. Below, loading/unloading operation of the wafer W between the loading slider 140 or the unlading slider 150 and the wafer stage WST will be explained in detail with reference to the drawings. Note that, in the explanation, it is defined that the wafer W is already loaded on the wafer stage WST. Also, in FIG. 5(A) to FIG. 5(F), when there are the loading arm 143, the unloading arm 153 and the wafer W at the loading position P5 or the unloading position P6 (when waiting), shown by a continuous line, when they are not on the loading position P5 or the unloading position P6 (when retracting), shown by a dashed line.

Figure 5A:
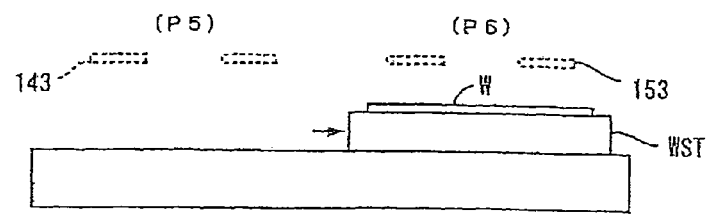
FIGS. 5(A)-5(F) demonstrate a wafer exchange treatment according to an embodiment of the present invention.
Figure 5B:
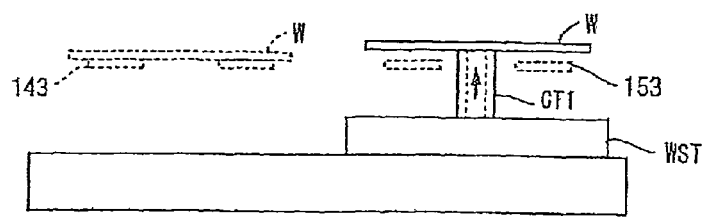
Figure 5C:
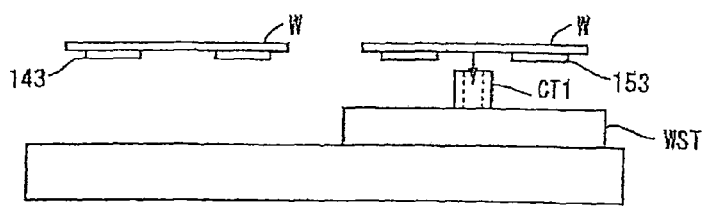

When an exposure treatment to the wafer W loaded on the wafer stage WST is finished (S10), a unloading operation for the wafer W and a loading operation for a next wafer are performed. First, as shown in FIG. 5(A), the wafer stage WST, which holds the exposure treatment finished the wafer W, is positioned to a predetermined unloading position P6 (S11), negative-pressure supply to a wafer holder of the wafer stage WST is released. Next, as shown in FIG. 5(B), the center table CT1 is elevated (S12), negative-pressure is supplied to the absorption opening of the center table CT1 simultaneously the wafer contact with a tip of the table, the wafer W is absorbed and retained to the center table CT1. At this time, the unloading arm 153 of the unloading slider 150 is retracted status from the unlading position P6. The raise of the center table CT1 is stopped at a position where slightly higher than an upper face of the unloading arm which is positioned at the unloading position P6, the unloading arm 153 is inserted into the unloading position P6 with this condition (S13). Subsequently, supplying negative-pressure to the absorption opening of the center table CT1 is released, as shown in FIG. (C), according to descent the center table CT1, the wafer W is delivered to the unloading arm 153 (S14), negative-pressure absorption to the wafer W is performed by the unlading arm 153 and the unloading arm 153 which holds the exposure treatment finished wafer W, is retracted from the unloading position P6 by the unloading slider 150.

Next, in a condition that the tip of the center table CT1 is positioned slightly lower than a lower face of the loading arm 143, namely, when the wafer stag WST is positioned at the loading position P5 in the after step (S18), descent operation of the center table CT1 is stopped in a condition that the tip of the center table CT1 is descended to a level where not interfere the loading arm 143 at the loading position P5 or so (S16). Note that, the description here, although it is specified S16 is performed after the retract operation (S15) of the unloading arm 153 from the unloading position P6, a performance of S16 may be operated after or in parallel with a performance of S15, if it is after the unloading of the wafer W to the unloading arm 153 (S14).

Figure 5D:
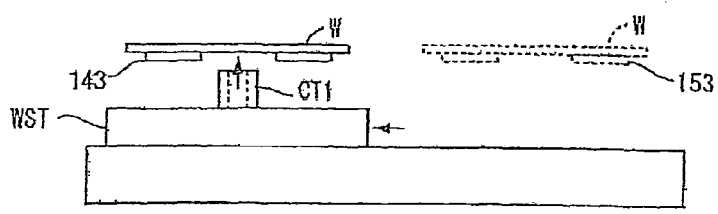

Here, the loading arm 143 holding a next wafer W to be loaded on the wafer stage WST, is positioned to the loading position P5 (S17). Note that, although this S17 is explained as a step after the S16, it can be performed at any time before positioning the wafer stage WST at the loading position P5 by S18 discussed below, it may be performed before an operation of S16 or an operation previous thereof, or may be performed in parallel to these operations. Next, as shown in FIG. 5(D), the wafer stage WST is driven at high speed and is positioned at the loading position P5 (S18). Note that, it is preferable to perform that moving of the wafer stage WST from the unloading portion P6 to the loading position P5 at the maximum acceleration velocity (maximum speed) of the wafer stage WST capability, since the wafer stage WST does not hold the wafer W, for reducing a required time of exchange operation.

Figure 5E:
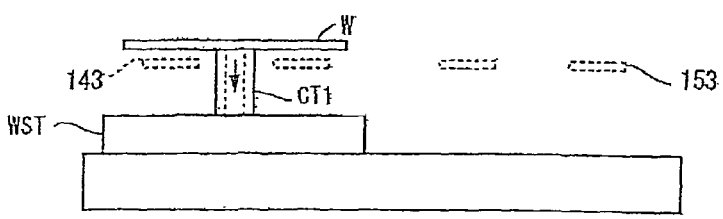

Once the wafer stage WST is positioned at the loading position P5, the center table CT1 is elevated immediately (S19). At this time, the negative-pressure absorption to the wafer W by the loading arm 143 is released. Next, as shown in FIG. 5(E), the center table CT1 is further elevated, the negative-pressure is supplied to the absorption opening of the center table CT1 simultaneously the wafer contact with a tip of the table, the wafer W is absorbed and retained to the center table CT1. The elevation of the center table CT1 is stopped when a condition being that a lower face of the wafer W is slightly spaced from the upper face of the loading arm 143. Thereby, the wafer W is delivered from the loading arm 143 to the center table CT1 (S20).

Figure 5F:
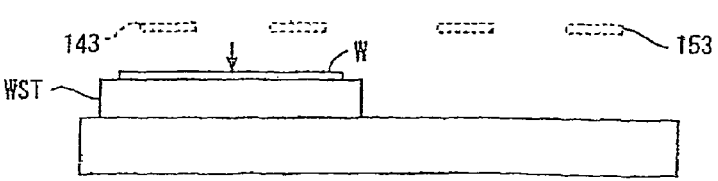

Next, for receiving a next wafer W, after retracting the loading arm 143 from the loading position P5 (S21), the center table CT1 is started to descend, when the tip of the center table CT1 is slightly higher than the upper face (loaded face) of the wafer stage WST (wafer holder), the negative-pressure supply to the absorbing opening of the center table CT1 is released, the center table CT1 moves to a bottom dead point and stops, namely, in a status that the tip end thereof is pocketed downwardly than the upper face of the wafer stage WST (wafer holder) (S22). Thereafter, negative-pressure absorption by the wafer holder of the wafer stage WST is performed, by absorbing and retaining the wafer W to the wafer holder, as shown in FIG. 5(F), the loading performance of the wafer W is completed. Thereafter, the wafer stage WST is positioned at a predetermined exposure position (directly underneath of the projection optical system PL), the exposure treatment is performed to the wafer W (S23). Subsequently, the series of operation are suitably repeated until finishing the lot.

According to the present embodiment, since the loading position P5 and the unloading position P6 of the wafer W are different position in a moving plane of the wafer stage WST (XY-plane), the wafer stage WST can be moved to the loading position P5 at high-speed after unloading operation of the wafer W, the loading operation for a next wafer W can be started rapidly without waiting retract action of the wafer W from the unloading position, therefore, the loading/unloading operation of the wafer W can be performed rapidly. Namely, comparing with the a conventional art that a loading position and a unloading position are arranged hierarchically (a position which is same in the XY-plane and is different to Z-direction), it is available to reduce a stroke associated with delivering the wafer W of the center table CT1, the moving speed of the center table CT1 cannot be so faster upon relating to the delivering of the wafer W, a time required to the loading/unloading performance can be shorten entirely.

Further, in the unloading portion P6 of the wafer W, after delivering the wafer W to the unloading arm 153 from the center table CT1, since descendent operation of the center table CT1 is stopped at a position lower than a lower face the tip end of the loading arm 143 and higher than the wafer holder (wafer loading face), the stroke of the center table CT1 according to an elevation operation for receiving the wafer W after positioning of the wafer stage WST to the loading position P5 can be shorten extremely, and thereby, it is possible to reduce a required time for loading/unloading operation to the wafer W.

Note that, a height position of the center table CT1 when the wafer stage WST moves from the unloading position P6 to the loading position P5 may be set arbitrary, if it is lower side than a lower face of the loading arm 143. It will be suitable height position, if the center table do not contact with other structural member exist around a moving pathway thereof, during movement of the wafer stage to the loading position P5.

Further, since it has been made that the loading arm 143 which holds a next wafer W is positioned after unloading the wafer W at the unloading position P6 and before the wafer stage W is positioned at the loading position P5, the loading operation of the wafer W with raising the center table CT1 can be started directly after the wafer stage WST is positioned at the loading position P5. Thereby it is possible to reduce a required time for loading/unloading operation to the wafer W.

Note that the above specified embodiment is described in order for easily understanding the present invention and is not described for limiting the present invention. Therefore, it is intended that the respective component disclosed in the above embodiment includes all design change and equivalents within a technical scope of the present invention. For example, it is specified that in the above embodiment, the loading arm 143, the unloading arm 153 are driven by the loading slider 140, the unloading slider 150, however, a scalar type robot such as the conveying robot 120 and other driving mechanism may be used for driving. Also, in the above embodiment, same heights (Z-direction) of the loading position P5 and the unloading position P6 are exemplified, these position in the Z-direction may be different.

Also, in the above embodiment, a step and scan type exposure apparatus as an exposure apparatus is exemplified and specified, it may be applied to a step and repeat scanning type exposure apparatus. Further, it can be applied not only to an exposure apparatus used for manufacturing semi-conductor, but also an exposure apparatus used for manufacturing a liquid crystal display, a plasma display, a thin film magnetic head, and image-pickup elements. Also, the present invention applied to an exposure apparatus used for transferring circuit patterns to a glass plate or silicon wafer and the like. Furthermore, in the above embodiment, although it is used that a light transmission type mask (reticle) in which a predetermined light shielding pattern (or phase pattern, light extinction pattern) formed on a light transmissive substrate, instead of this reticle, an electronic mask to form a pattern to be exposed which is disclosed in U.S. Pat. No. 6,778,257 may be used. Also, the present invention may be applied an exposure apparatus (lithography system) to form line and space patterns on a wafer W by making interference bands on a wafer W which is disclosed in International Publication No. 2001/035168. Namely, the present invention can be applied to an exposure apparatus regardless of an exposure method, purpose of use and the like. Further, in the above embodiment, although it is exemplified that loading/unloading the wafer W on the wafer stage W, the present invention is not limited to this, it may be applicable to loading/unloading reticle R to the reticle stage RST. Furthermore, in the above embodiment, although the exposure apparatus is exemplified, it can be applied to an apparatus having movable stages to which substrates, test samples, other articles are loaded (article inspection apparatus, article test apparatus, article processing apparatus).

A semiconductor as a device is manufactured through, a step of a function and performance design of the device, a step of manufacturing a reticle based on the design step, a wafer manufacturing step from silicone material, a step of exposure transferring the reticle patter to a wafer by the exposure apparatus and the like as stated in the above embodiment, a device assembly step (including dicing process, bonding process, packaging process), a verification step and the like.

This disclosure relates to a main subject included in Japanese Patent Application No. 2005-304602 filed on Oct. 19, 2005, and all of its disclosures are obviously incorporated hereto as reference.

The invention claimed is:

1. A method for loading/unloading an article to a placing table that is moved for positioning within a predetermined plane and has a vertically moving member that moves vertically while holding the article between a position over the placing table and a placing surface of the article provided on the placing table comprising;
   positioning said placing table, where the article to be unloaded is placed, to a second position that is different from a first position within said predetermined plane,
   unloading the article that exists on the placing table that is positioned at said second position after positioning said placing table to said second position,
   moving said placing table from said second position to said first position while said vertically moving member is positioned at a position lower than a lower surface of a loading member holding a next article waiting for loading over said first position and higher than the placing surface of the placing table, after unloading said article from said placing table,
   allowing a loading member holding the next article to be loaded onto the placing table to wait over the first position before the placing table is positioned at the first position, and
   loading the next article onto the placing table positioned at the first position after moving said placing table from said second position to said first position.

2. The method for loading/unloading an article as set forth in claim 1, wherein;
   when said placing table is moved from said second position to said first position, the movement of said placing table performed at a maximum acceleration which is available to drive said placing table.

3. An exposure method for forming a pattern by an irradiating exposure beam on an article held on a placing table that is moved for positioning within a predetermined plane and has a vertically moving member that moves vertically while holding the article between over the placing table and a placing surface of the article provided on the placing table comprising;

positioning said placing table, where the article to be unloaded is placed, to a second position that is different from a first position within said predetermined plane, unloading the article that exists on the placing table that is positioned at said second position after positioning said placing table to said second position, moving said placing table from said second position to said first position while said vertically moving member is positioned at a position lower than a lower surface of a loading member holding a next article waiting for loading over the first position and higher than the placing surface of the placing table after unloading said article from said placing table, allowing a loading member holding the next article to be loaded onto the placing table to wait over the first position before the placing table is positioned at the first position, loading the next article onto the placing table positioned at the first position after moving said placing table from said second position to said first position, and performing exposure treatment with positioning said placing table to an exposure position which is different from said first position and said second position, after loading said next article onto said placing table at said first position and before positioning said placing tale to said second position.

4. A method for making a device comprising at least one portion of a circuit pattern for the device on said article, by using the exposure method as set forth in claim 3.

5. A loading/unloading unit comprising;

a placing table to place an article, that is movable between a first position and a second position which are different from each other in a predetermined plane, a loading member which loads the article to said placing table positioned at said first position, an unloading member which unloads the article placed on said placing table positioned at said second position from said placing table, and a control device wherein:

said placing table comprises a vertically moving member that holds the article and vertically moves between over the placing table and a placing surface of the article provided on the placing table, said control device controls said placing table, said loading member and said unloading member so that, after unloading the article placed on said placing table positioned at said second position by said unloading member, said placing table is moved to said first position while said vertically moving member is positioned at a position lower than a lower surface of the loading member and higher than the placing surface, said loading member holding a next article to be loaded on said placing table is waited over said first position before said placing table is positioned at said first position, and after this, said next article is loaded from said loading member to said placing table positioned at said first position.

6. An exposure apparatus which forms a pattern on an article by an irradiating exposure beam to said article placed on said placing table, wherein said exposure apparatus comprises a loading/unloading unit as set forth in claim 5.

* * * * *

UNITED STATES PATENT AND TRADEMARK OFFICE
CERTIFICATE OF CORRECTION

PATENT NO. : 8,279,406 B2
APPLICATION NO. : 12/083863
DATED : October 2, 2012
INVENTOR(S) : Taro Sugihara It is certified that error appears in the above-identified patent and that said Letters Patent is hereby corrected as shown below:

Title Page, Item (75) Inventor, delete "Tara Sugihara, Tokyo (JP)" and insert
-- Taro Sugihara, Tokyo (JP) --, therefor.

Column 10, Line 64, In Claim 2, delete "performed" and insert -- is performed --, therefor.
Column 11, Line 30, In Claim 3, delete "tale" and insert -- table --, therefor.
Column 11, Line 32, In Claim 4, delete "at" and insert -- exposing at --, therefor.

Signed and Sealed this
Twelfth Day of March, 2013

Teresa Stanek Rea
*Acting Director of the United States Patent and Trademark Office*